(12) United States Patent
Coolbaugh et al.

(10) Patent No.: US 7,491,632 B2
(45) Date of Patent: Feb. 17, 2009

(54) BURIED SUBCOLLECTOR FOR HIGH FREQUENCY PASSIVE SEMICONDUCTOR DEVICES

(75) Inventors: Douglas D. Coolbaugh, Highland, NY (US); Xuefeng Liu, South Burlington, VT (US); Robert M. Rassel, Colchester, VT (US); David C. Sheridan, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 11/164,108

(22) Filed: Nov. 10, 2005

(65) Prior Publication Data
US 2007/0105354 A1    May 10, 2007

(51) Int. Cl.
*H01L 21/425* (2006.01)
(52) U.S. Cl. .................................... 438/526
(58) Field of Classification Search ............... 438/526
See application file for complete search history.

(56) References Cited

U.S. PATENT DOCUMENTS

| | | | |
|---|---|---|---|
| 6,307,227 B2 | 10/2001 | Fujii | |
| 6,645,802 B1 | 11/2003 | Li et al. | |
| 7,008,836 B2 | 3/2006 | Algotsson et al. | |
| 2002/0102804 A1 | 8/2002 | Nagase et al. | |
| 2002/0146889 A1* | 10/2002 | Coolbaugh et al. | 438/401 |
| 2003/0059985 A1* | 3/2003 | Adkisson et al. | 438/149 |
| 2003/0064575 A1 | 4/2003 | Losehand et al. | |
| 2004/0227061 A1 | 11/2004 | Clevenger et al. | |
| 2005/0014329 A1 | 1/2005 | Williams et al. | |
| 2005/0040430 A1 | 2/2005 | Ahrens et al. | |
| 2005/0121702 A1* | 6/2005 | Voldman et al. | 257/288 |

OTHER PUBLICATIONS

Konaka, S., "A Study of High Cut-off Frequency (ft) and High Collector Current Characteristics for Super Self-aligned Bipolar Transistor (SST) With a New Deep SIC (Selectively Ion-implanted Collector) Region" *Transactions of the Institute of Electronics, Information and communication Engineers C. Inst. Electron. Inf. & Commun.* (May 2001) pp. 428-429, vol. J84-C(5), English-language abstract only.

* cited by examiner

*Primary Examiner*—Bradley K Smith
(74) *Attorney, Agent, or Firm*—Scully, Scott, Murphy & Presser, P.C.; Richard Kotulak, Esq.

(57) ABSTRACT

A method of fabricating a buried subcollector in which the buried subcollector is implanted to a depth in which during subsequent epi growth the buried subcollector remains substantially below the fictitious interface between the epi layer and the substrate is provided. In particular, the inventive method forms a buried subcollector having an upper surface (i.e., junction) that is located at a depth from about 3000 Å or greater from the upper surface of the semiconductor substrate. This deep buried subcollector having an upper surface that is located at a depth from about 3000 Å or greater from the upper surface of the substrate is formed using a reduced implant energy (as compared to a standard deep implanted subcollector process) at a relative high dose. The present invention also provides a semiconductor structure including the inventive buried subcollector which can be used as cathode for passive devices in high frequency applications.

13 Claims, 3 Drawing Sheets

BURIED SUBCOLLECTOR FOR HIGH FREQUENCY PASSIVE SEMICONDUCTOR DEVICES

FIELD OF THE INVENTION

The present invention relates to a semiconductor structure, and more particularly to a semiconductor structure including a buried subcollector that can be used as a cathode for passive devices in high frequency applications. The term "high frequency" is used throughout the present application, to denote a frequency of about 10 GHz or greater. The present application is also related to a method of forming the semiconductor structure of the present invention.

BACKGROUND OF THE INVENTION

High frequency applications require a variety of passive components, which enable reduced circuit size and design complexity. Bipolar and Complementary Metal Oxide Semiconductor (BiCMOS) technologies tend to implement a standard buried subcollector process that implants a shallow (on the order of less than 500 Å from the surface of the semiconductor substrate), very high dose (on the order of about $10^{15}$ atoms/cm$^2$ or greater) implant and an epitaxial film grown over the wafer post implantation. A buried subcollector is required and is tuned for the bipolar device. In high-end BiCMOS applications, the buried subcollector tends to be shallower and shallower in order to give the necessary device characteristics for faster bipolar devices in subsequent generations. This causes issues with many of the passive devices that are required for high frequency applications.

A typically prior art method of forming a buried subcollector in a semiconductor substrate is shown in FIGS. 1A-1B. Specifically, FIG. 1A illustrates an initial step in which dopant ions 14 are implanted into a semiconductor substrate 10 using a patterned mask 12 to define an area where said dopant ions 14 are incorporated into the substrate. Reference numeral 16 denotes the subcollector region that is formed in the substrate 10 using this prior art implant step.

FIG. 1B shows the structure after stripping the patterned mask 12 and forming an epitaxial (i.e., epi) semiconductor layer 18 on the substrate 10 including subcollector 16. During growth of the epi layer 18, the dopant ions within the subcollector region 16 are activated and diffuse upwards. Typically, the formation of the epi layer 18 causing all or a majority of the subcollector region 16 to be present in the epi layer 18. The horizontal dotted line in FIG. 1B represents a fictitious interface between the substrate 10 and the epi layer 18. As such, the prior art process does not provide a 'true' buried subcollector that remains buried within the substrate.

It has been shown that in 0.25 μm BiCMOS generation, and in subsequent generations, the epitaxial thickness is too thin and the buried implant region is too shallow to build a high performance hyperabrupt varactor diode device, high frequency Schottky barrier diode or a vertical PIN diode. With prior art buried subcollectors used by bipolar devices, it is nearly impossible to create high performance/frequency passive elements.

The high abrupt varactor diode tends to lose merits of performance such as tunability and, in addition, decreases breakdown voltage/increase reverse bias leakage when one implements a later generation BiCMOS NPN buried subcollector process. The Schottky barrier diode cut-off frequency (fc), which is inversely proportional to the devices 'on' resistance (Ron) and junction capacitance (Cj), tends to degrade/ diminish in subsequent generations due to the scaling of the depth of the buried subcollector. The PIN diode sees the intrinsic region decrease in-depth and clarity with shallower subcollectors.

One of the solutions to the above thinning of the subcollector depth is to implement a dual epi process to create a unique subcollector for the passive devices, which would be deeper than the standard bipolar's subcollector. This adds complexity in the processing due to issues with electrically contacting the deeper unique buried subcollector without additional reachthrough implant levels and, in addition, adds a high cost by adding an entire epi and re-oxidation process for just the high end passive devices.

Another solution that helped to improve the Schottky barrier diode and hyperabrupt varactor breakdown voltage and the tunability of the hyperabrupt diode is the implementation of a unique very deep implanted subcollector implant post the standard buried subcollector epi process. This deep implanted subcollector process has limitations on what implant doses can be used and the sheet resistivity of this process tends to run approximately 100 ohm/square compared to less than 10 ohm/square for the conventional buried subcollector. There is a tradeoff between the energy and dose of this implant—one could increase the dose, but would need to then decrease the energy/depth which then degrades the tunability, or one could implant with higher energy/deeper, but would then need to decrease the dose which tends to degrade the quality factor. This increase in resistance degrades the quality factor of a hyperaburpt varactor at high frequencies due to the lateral resistance increase of this deep implanted subcollector. The Schottky barrier diode observes a significant increase in the Ron with a deep implanted subcollector thus the Fc degrades. Moreover, the tail on this deep implanted subcollector implants eliminate any possibility to build a PIN diode.

SUMMARY OF THE INVENTION

The present invention provides a method of fabricating a buried subcollector for a high frequency passove semiconductor device in which the buried subcollector is implanted to a depth in which during subsequent epi growth the buried subcollector remains substantially below the fictitious interface between the epi layer and the substrate. In particular, the inventive method forms a buried subcollector having an upper surface (i.e., junction) that is located at a depth from about 3000 Å or greater from the upper surface of the semiconductor substrate. This deep buried subcollector having an upper surface that is located at a depth from about 3000 Å or greater from the upper surface of the substrate is formed using a reduced implant energy (as compared to a deep implanted subcollector process) at a relatively high dose.

By 'reduced implant energy', it is meant the implantation of the subcollector is performed using an energy of about 500 keV or less. In the prior art deep implanted subcollector process, the implant is typically performed at an energy of about 800 keV or greater. By 'relatively high dose' it is meant, that the present invention utilizes an implant dosage of about $10^{14}$ atoms/cm$^2$ or greater.

In general terms, the method of the present invention comprises:

forming a buried subcollector region having an upper junction that is located at a depth from about 3000 Å or greater from an upper surface of a semiconductor substrate; and forming an epitaxial semiconductor layer on said upper surface of said semiconductor substrate, wherein all of said buried subcollector remains buried within said semiconductor substrate after formation of said epitaxial semiconductor layer.

The method described above forms a quasi buried subcollector that can be used as a cathode for passive devices. The inventive buried subcollector, which remains buried within the substrate, is different from prior art subcollectors in which all or the majority of prior art subcollectors are located within the epi layer after that layer has been formed.

In addition to the method described above, the present invention also provides a semiconductor structure including the inventive buried subcollector. Specifically, and in general terms, the semiconductor structure comprises:

a semiconductor substrate having an epi semiconductor layer located on a surface thereof; and a buried subcollector located entirely in said semiconductor substrate, said buried subcollector having a dopant concentration of about $10^{18}$ atoms/cm$^3$ or greater.

Since the buried subcollector of the present invention is maintained within the semiconductor substrate, the inventive buried subcollector can be used as a cathode for passive devices in high frequency applications.

DETAILED DESCRIPTION OF THE INVENTION

The present invention, which provides a buried subcollector process for high frequency passive devices, and the resultant structure formed by this method, will now be described in greater detail by referring to the following discussion and drawings that accompanying the present application. It is noted that the drawings of the present application are provided for illustrative purposes and, as such, they are not drawn to scale.

Figure 1A:
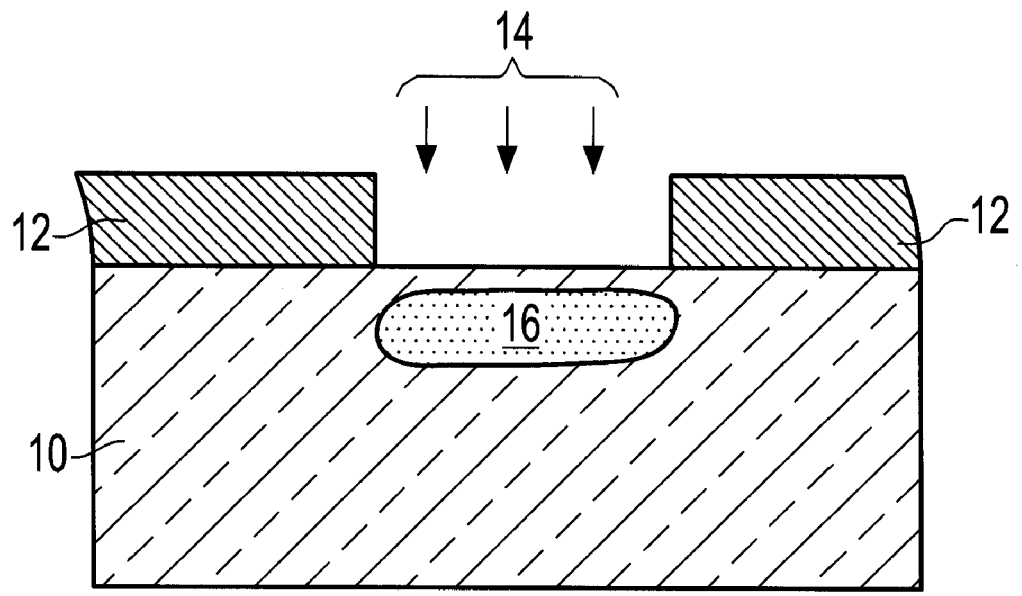
FIGS. 1A-1B are pictorial representations (through cross sectional views) illustrating prior art processing steps for fabricating a buried subcollector in which all or the majority thereof is located within an epi layer of the structure.
Figure 1B:
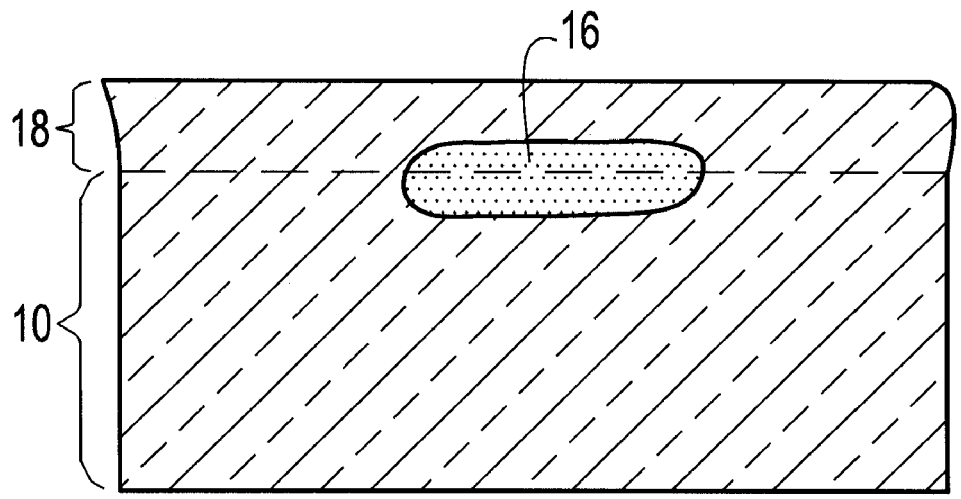
Figure 2A:
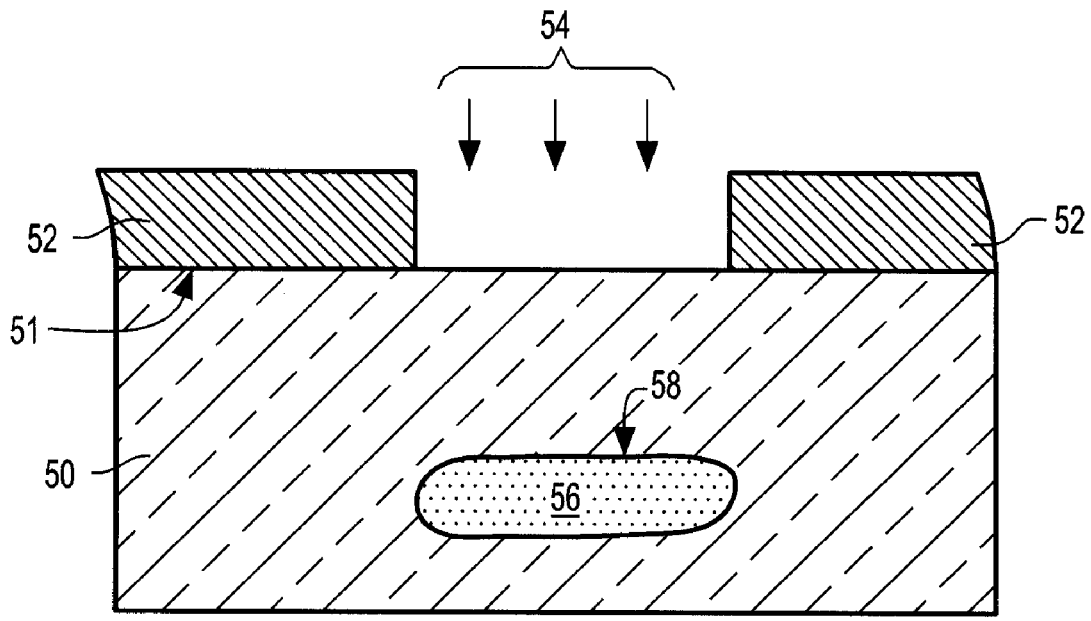
FIGS. 2A-B are pictorial representations (through cross sectional views) illustrating the basic processing steps of the present invention for fabricating a buried subcollector that remains buried in the semiconductor substrate even after epi layer formation.
Figure 2B:
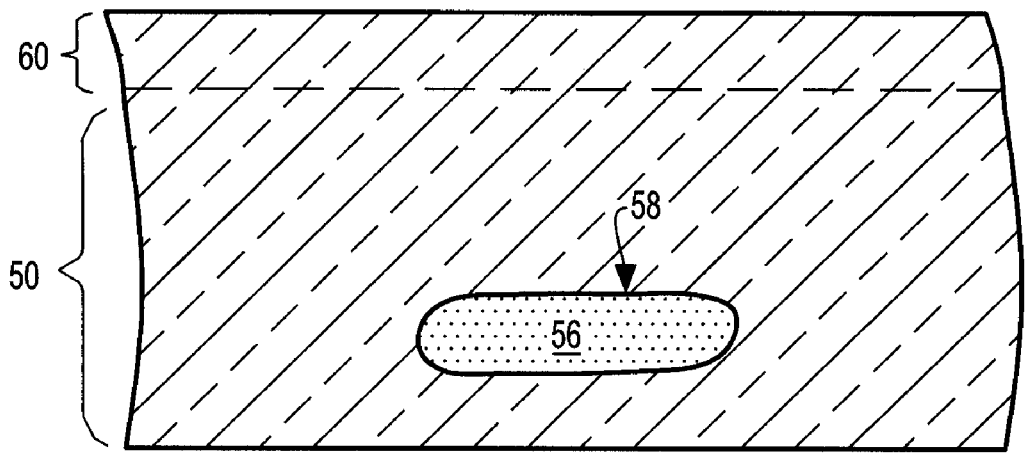

FIGS. 2A-2B are pictorial representations (through cross sectional views) that depict the basic processing steps of the present invention. As shown, the inventive process forms a buried subcollector that remains buried within the semiconductor substrate even after epi growth. This is opposite to the prior art process shown in FIGS. 1A-1B where all or the majority of the buried subcollector is located with the epi layer. Thus, since the subcollector of the present invention remains buried within the semiconductor substrate even after epi growth, it can be used as a cathode for passive devices, which have utility for high frequency applications.

FIG. 2A shows the initial step of the present invention in which dopant ions 54 are introduced into selected regions of a semiconductor substrate 50 via a masked ion implantation process. Reference numeral 56 denotes the subcollector of the present invention (i.e., a dopant region having the same conductivity as that of the dopant ions 54). As shown, the semiconductor substrate 50 includes a patterned mask 52 that includes at least one opening in which the dopant ions 54 can be introduced into the substrate. Thus, although a single opening is shown, the present invention contemplates a plurality of openings within the patterned mask 52 where the dopants ions 54 can be introduced into the semiconductor substrate 50.

The semiconductor substrate 50 used in the present invention includes any semiconducting material. Illustratively, the semiconductor substrate 50 includes, but is not limited to: Si, SiC, SiGe, SiGeC, Ge alloys, GaAs, InAs, InP and other III-V compound semiconductors. Multilayers of these semiconductors are also contemplated herein as well as a conventional SOI (silicon-on-insulator) or SGOI (silicon germanium-on-insulator) substrate. The semiconductor substrate 50 may have a single crystal orientation or it may include regions that have different crystal orientations. The semiconductor substrate may be strained, unstrained or contain regions of strain and unstrain therein. The semiconductor substrate 50 may also be undoped or doped with a doping ion having a different conductivity than that of dopant ions 54. Typically, the semiconductor substrate 50 employed in the present invention is a Si-containing semiconductor such as, for example, Si, SiGe, SiC, and SiGeC. Preferably, the semiconductor substrate 50 is Si.

Next, patterned mask 52 having at least one opening is formed on an upper surface 51 of the semiconductor substrate 50. The patterned mask 52 having at least one opening is formed by first depositing at least one mask material on the surface of the substrate 50. The mask material may comprise a photoresist, a hard mask material (oxide or nitride) or combinations thereof. For example, a stack comprising an upper photoresist layer and a lower oxide can be used as the mask material of the present invention. The as deposited mask material has a thickness that is generally thick enough to prevent dopant ions from being introduced into the substrate. Typically, the as deposited mask material has a thickness from about 1 to about 5 µm, with a thickness from about 2 to about 4 µm being more typical.

The at least one mask material is formed via a conventional deposition process including, but not limited to: spin-on coating, chemical vapor deposition (CVD), plasma enhanced chemical vapor deposition (PECVD), evaporation, and chemical solution deposition. After forming the at least one mask material on the surface of the semiconductor substrate 50, the at least one mask material is patterned by lithography and optionally, etching. The photolithographic process includes exposing a resist material to a pattern of radiation and developing the exposed resist utilizing a conventional resist developer. Etching, which is used in cases when a hard mask material is used, may comprise a dry etching technique (such as, reactive-ion etching, ion beam etching, plasma etching or laser ablation) or a chemical wet etching process. As shown, the patterned mask 52 protects portions of the semiconductor substrate 50, while leaving at least one other portion of the semiconductor substrate 50 exposed. It is at the exposed portion(s) of the semiconductor substrate 50 where the dopant ions 54 are introduced thus forming subcollector region, i.e., dopant region, 56 in selected areas of the semiconductor substrate 50.

After forming the patterned mask 52 having at least one opening on the surface of substrate 50, dopant ions 54 are introduced into the substrate. The present invention contemplates an embodiment in which p-type dopant ions 54 or n-type dopant ions are used.

The term "p-type dopant" is used in the present application to describe an element from Group IIIA of the Periodic Table of Elements. Examples of p-type dopants include, but are not limited to: Ga, Al, B, $BF_2$, In or mixtures thereof. In the present application, In or B are particularly preferred.

The term "n-type dopant" is used in the present application to describe an element from Group VA of the Periodic Table of Elements. Examples of n-type dopants include, but are not limited to: P, As, Sb or mixtures thereof. In the present application, P or As are particularly preferred. The exact type of dopant ions introduced is dependent upon the conductivity of the initial substrate as well as the conductivity of the final devices to be formed on the substrate. The selection of the conductivity type for dopant ions 54 is well within the knowledge of a skilled artisan.

It is observed that the implant conditions for introducing the dopant ions 54 into the semiconductor substrate 50 are sufficient to form a buried subcollector 56 having an upper surface (i.e., junction) 58 that is located at a depth from about 3000 Å or greater from the upper surface 51 of the semiconductor substrate 50. More typically, the upper surface 58 of the buried subcollector 56 is located at a depth from about 4000 to about 8000 Å below the upper surface 51 of semiconductor substrate 50. It is noted that when the buried subcollector has the upper surface 58 within the ranges mentioned above, the buried subcollector 56 remains buried within the semiconductor substrate 50 even after formation of an epi semiconductor layer thereon (to be subsequently formed).

This deep buried subcollector 56 having an upper surface 58 that is located at a depth from about 3000 Å or greater from the upper surface 51 of the substrate 50 is formed using a reduced implant energy (as compared to deep implanted subcollector process) at a relative high dose. The ion implantation may occur at nominal room temperature (i.e., 20°-30° C.) or at a substrate temperature greater than 35° C. with a temperature from about 100° to about 300° C. being more typical.

By 'reduced implant energy', it is meant the implantation of the subcollector is performed using an energy of about 500 keV or less. In the prior art deep implanted subcollector process, the implant is typically performed at an energy of about 800 keV or greater. By 'relatively high dose' it is meant, that the present invention utilizes an implant dosage of about $10^{14}$ atoms/cm$^2$ or greater. It is noted that the above energy and dosage ranges are general and may vary somewhat depending on the type of dopant ions being implanted. Typically, the buried subcollector 56 has a dopant concentration of about $10^{18}$ atoms/cm$^3$ or greater, with a dopant concentration from about $5 \times 10^{19}$ to about $10^{20}$ atoms/cm$^3$ being even more typical.

For example, when p-type dopants are employed in the present invention the following conditions can be used to create the buried subcollector 56: p-type dopant ions 54 such as Boron are implanted using an energy of greater than 90 keV, with an energy from about 120 to about 300 keV being more typical. The dosage of the p-type dopant being introduced by ion implantation is typically greater than $10^{14}$ atoms/cm$^2$, with a dosage from about $10^{15}$ to about $10^{16}$ atoms/cm$^2$ being more typical. Within the dosages provided above, the p-type subcollector typically has a p-type dopant concentration of greater than $10^{19}$ atoms/cm$^3$, with a concentration from about $5 \times 10^{19}$ to about $5 \times 10^{20}$ atoms/cm$^3$ being more typical.

When n-type dopants ions 54 are used, the following conditions can be used in forming the buried subcollector 56: n-type dopant ions such as Phosphorus are implanted using an energy of greater than 400 keV and up to about 500 keV. The dosage of the n-type dopant being introduced by ion implantation is typically greater than $10^{14}$ atoms/cm$^2$, with a dosage from about $10^{15}$ to about $10^{16}$ atoms/cm$^2$ being more typical. Within the dosage provided above, the n-type subcollector has an n-type dopant concentration of greater than $10^{18}$ atoms/cm$^3$, with a concentration from about $10^{19}$ to about $10^{20}$ atoms/cm$^3$ being more typical.

Next, the patterned mask 52 is removed from the surface of the semiconductor substrate 50 utilizing a conventional stripping process well known in the art. Epi semiconductor layer 60 is then formed on the surface 51 of the semiconductor substrate 50 utilizing a deposition method that is capable of growing a low-defect epi semiconductor layer. The epi semiconductor layer 60 may comprise the same or different, preferably the same, semiconductor material as that of the semiconductor substrate 50. Illustrative examples of suitable deposition methods that can be employed in the present invention include, but are not limited to: chemical vapor deposition (CVD), plasma-assisted CVD, molecular beam epitaxial deposition, and the like. Preferably, the epi semiconductor layer 60 is comprised of Si. The precursors used in forming the epi layer can, in some embodiments, be isotopically pure. The thickness of the epi semiconductor layer 60, which typically has a monocrystalline structure, is from of about 200 nm to about 1000 nm, with a thickness of from about 400 to about 700 nm being more highly preferred. The epi semiconductor layer 60 can be unstrained or strained and it will have the same crystallographic orientation as that of the semiconductor substrate 50. It is noted that during the growth of epi semiconductor layer 60, dopant ions within the buried subcollector 56 are activated and some upward diffusion may occur. Despite the upward diffusion, all of the buried subcollector remains buried within the semiconductor substrate 50 instead of migrating to the epi layer 60 as is the case for the prior art process mentioned above. The result structure including the buried subcollector 56 of the present invention buried below the epi layer 60 within substrate 50 is shown, for example, in FIG. 2B.

Figure 3:
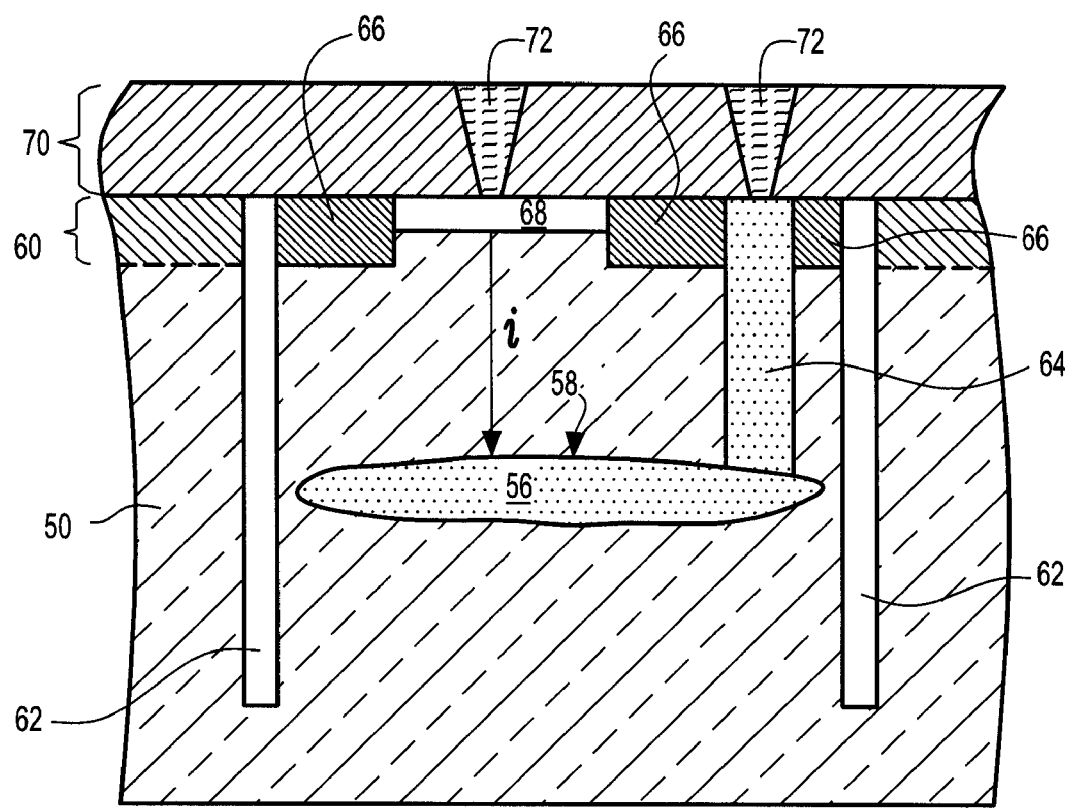
FIG. 3 is a pictorial representation (through a cross sectional view) showing a structure including the inventive buried subcollector which can be used as a passive device cathode.

At this point of the present invention, conventional bipolar and/or complementary metal oxide semiconductor (CMOS) processing can be performed and thereafter conventional interconnect processing can be performed providing the structure shown in FIG. 3. In FIG. 3, reference numeral 62 denotes deep isolation regions, reference numeral 64 denotes a reachthrough implant region, reference numeral 66 denotes shallow trench isolation regions, reference numeral 68 denotes the active region of the passive device, reference numeral 70 denotes an interconnect dielectric, and reference numeral 72 denotes metal via contacts to interconnect the subsequent metal wiring level to the active region 68 and cathode contact region 64. It is noted that the buried subcollector 56 shown in FIG. 3 is the cathode of the high end passive device (PIN diode) and that the structure shown therein can be used in a high frequency application. In the prior art, all or the majority of the subcollector is present in the epi layer which reduces the intrinsic region between the active region of the passive device and the subcollector. In the present invention, this intrinsic region labeled as "i" is greater than that of the prior art. Typically, the intrinsic region of the present invention is about 2 times or greater than that of the prior art.

Table 1 shows the prior art and the inventive methods' corresponding cathode depth and sheet resistance along with some Schottky barrier diode (SBD) data from a 5 μm×5 μm device. The extrapolated data shows that the inventive method provides a lower resistance cathode than the prior art deep implanted subcollector process and a much deeper cathode than the prior art buried subcollector process that utilizes a 0.5 μm Si Nepi growth process. The deeper and lower resistance cathode allows the SBD to have a sufficiently higher reverse breakdown voltage and cutoff Frequency ($Fc=1/(2nR_{on}C_j)$) which is an important figure of merit for high frequency/millimeter wave applications.

It should also be further noted that the inventive method in which the buried subcollector is formed prior to epi growth allows the implant energy to be reduced by at least 50% which allows the implant dose to increase by threefold compared with prior art deep implanted subcollector processing. This enables the inventive subcollector 56 to be deeper than the prior art buried subcollector process and still have a low resistance (on the order of about 10 ohm/square or less) making it ideal as a cathode for passive devices having high frequency applications.

TABLE 1

| Cathode Process | Depth into Si of Cathode Peak Concentration (μm) | Cathode Resistance (ohm/sq.) | 5 μm × 5 μm SBD Reverse Bias Breakdown (V) | 5 μm × 5 μm SBD Cutoff Frequency (GHz) |
| --- | --- | --- | --- | --- |
| Prior Art - Buried Subcollector | approximately 0.5 | approximately 8.7 | approximately 4.0 | approximately 200 |
| Prior Art - Deep Implanted Subcollector | approximately 1.0 | approximately 145 | approximately 12 | approximately 150 |
| Invention | approximately 1.0 | approximately 8.0 | approximately 11 | approximately 500 |

While the present invention has been particularly shown and described with respect to preferred embodiments thereof, it will be understood by those skilled in the art that the foregoing changes in forms and details may be made without departing from the spirit and scope of the present application. It is therefore intended that the present invention not be limited to the exact forms and details described and illustrated herein, but fall within the scope of the appended claims.

What is claimed is:

1. A method of fabricating a semiconductor structure comprising:

forming a buried subcollector region having a dopant concentration of about $10^{18}$ atoms/cm$^3$ or greater and an upper junction that is located at a depth from about 3000 Å or greater from an upper surface of a semiconductor substrate, said forming including providing a patterned mask on said upper surface of said semiconductor substrate, said patterned mask having at least one opening that exposes a portion of said upper surface of said semiconductor substrate, ion implanting a dopant ion through said at least one opening at an ion implant energy of about 500 keV or less and an ion dose of about $10^{14}$ atoms/cm$^2$ greater, and removing said patterned mask; and forming an epitaxial semiconductor layer on said upper surface of said semiconductor substrate, wherein all of said buried subcollector remains buried within said semiconductor substrate after formation of said epitaxial semiconductor layer.

2. The method of claim 1 wherein said dopant ions are p-type dopant ions comprising at least one element from Group IIIA of the Periodic Table of Elements.

3. The method of claim 2 wherein said p-type dopant ions are implanted using an energy of greater than 90 keV.

4. The method of claim 1 wherein said dopant ions are n-type dopant ions comprising at least one element from Group VA of the Periodic Table of Elements.

5. The method of claim 4 wherein said n-type dopant ions are implanted using an energy of greater than 400 keV.

6. The method of claim 1 wherein said forming the epitaxial semiconductor layer comprises one of chemical vapor deposition (CVD), plasma-assisted CVD, or molecular beam epitaxial deposition.

7. The method of claim 1 wherein said forming the epitaxial semiconductor layer comprising a deposition process in which isotopically pure precursors are employed.

8. The method of claim 1 wherein said ion implanting is performed at a temperature from about 20° to about 30° C.

9. The method of claim 1 wherein said ion implanting is performed at a temperature of greater than 35° C.

10. The method of claim 1 wherein said dopant concentration is from about $5\times10^{19}$ to about $10^{20}$ atoms/cm$^3$.

11. The method of claim 1 wherein said dopant ion is boron and said ion implant energy is from about 120 to about 300 keV.

12. The method of claim 1 wherein said buried subcollector has a cathode resistance of about 10 ohm/square or less.

13. A method of fabricating a semiconductor structure comprising:

forming a buried subcollector region having a cathode resistance of about 10 ohm/square or less and an upper junction that is located at a depth from about 3000 Å or greater from an upper surface of a semiconductor substrate, said forming including providing a patterned mask on said upper surface of said semiconductor substrate, said patterned mask having at least one opening that exposes a portion of said upper surface of said semiconductor substrate, ion implanting a dopant ion through said at least one opening at an ion implant energy of about 500 keV or less and an ion dose of about $10^{14}$ atoms/cm$^2$ or greater, and removing said patterned mask; and forming an epitaxial semiconductor layer on said upper surface of said semiconductor substrate, wherein all of said buried subcollector remains buried within said semiconductor substrate after formation of said epitaxial semiconductor layer.

* * * * *